(12) United States Patent
Schaller et al.

(10) Patent No.: US 9,694,989 B2
(45) Date of Patent: Jul. 4, 2017

(54) WORKPIECE HANDLING SYSTEM AND METHODS OF WORKPIECE HANDLING

(71) Applicant: VARIAN SEMICONDUCTOR EQUIPMENT ASSOCIATES, INC., Gloucester, MA (US)

(72) Inventors: Jason M. Schaller, Austin, TX (US); Robert Brent Vopat, Austin, TX (US); Charles T. Carlson, Cedar Park, TX (US); Malcolm N. Daniel, Austin, TX (US); Aaron P. Webb, Austin, TX (US); William T. Weaver, Austin, TX (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 632 days.

(21) Appl. No.: 13/658,512

(22) Filed: Oct. 23, 2012

(65) Prior Publication Data
US 2013/0108401 A1    May 2, 2013

Related U.S. Application Data

(60) Provisional application No. 61/554,715, filed on Nov. 2, 2011.

(51) Int. Cl.
*B65G 47/91* (2006.01)
*B65G 49/06* (2006.01)
(Continued)

(52) U.S. Cl.
CPC ........... *B65G 49/00* (2013.01); *B65G 47/918* (2013.01); *B65G 49/061* (2013.01);
(Continued)

(58) Field of Classification Search
CPC .... B65G 47/34; B65G 47/907; B65G 47/918; B65G 2203/041; H01L 21/67736; H01L 21/67754
(Continued)

(56) References Cited

U.S. PATENT DOCUMENTS 3,757,961 A * 9/1973 Jacobs .................... B65G 25/02
198/621.1
3,774,778 A * 11/1973 Flaig ....................... B65B 35/38
414/591
(Continued)

FOREIGN PATENT DOCUMENTS

CN    1698191 A    11/2005
CN    1898771 A    1/2007
(Continued)

*Primary Examiner* — James Keenan
(74) *Attorney, Agent, or Firm* — Nields, Lemack & Frame, LLC (57) ABSTRACT

One embodiment of this workpiece handling system has conveyor belts and a load lock. A first swap robot holds and transports workpieces between a build station and the load lock. A gantry robot transports the workpieces between each of the conveyor belts and the first swap robot. In one instance, processed workpieces are transported from the first swap robot to a first conveyor belt and unprocessed workpieces are transported from a second conveyor belt to the first swap robot using the gantry robot. A second swap robot also may be used with the first swap robot to load and unload workpieces from the load lock.

11 Claims, 8 Drawing Sheets

(51) Int. Cl.
*H01L 21/677* (2006.01)
*B65G 49/00* (2006.01)
*H01L 21/67* (2006.01)

(52) U.S. Cl.
CPC .. *H01L 21/67213* (2013.01); *H01L 21/67733* (2013.01); *H01L 21/67736* (2013.01); *H01L 21/67754* (2013.01); *B65G 2203/041* (2013.01)

(58) Field of Classification Search
USPC ............ 198/346.2, 602; 414/222.07, 222.09, 414/222.11, 222.13, 226.01, 749.1, 751.1, 414/752.1
See application file for complete search history.

(56) References Cited

U.S. PATENT DOCUMENTS

| | | | |
|---|---|---|---|
| 4,141,458 A | 2/1979 | Brooks et al. | |
| 6,299,404 B1 * | 10/2001 | Muka | B25J 9/107 294/87.1 |
| 6,758,647 B2 * | 7/2004 | Kaji et al. | 414/217 |
| 8,143,595 B2 * | 3/2012 | Tatemichi et al. | 250/453.11 |
| 8,308,418 B2 * | 11/2012 | Ma et al. | 414/626 |
| 8,309,374 B2 * | 11/2012 | Porthouse et al. | 438/19 |
| 8,444,364 B2 * | 5/2013 | Blonigan et al. | 414/221 |
| 8,698,104 B2 * | 4/2014 | Weaver et al. | 250/491.1 |
| 8,920,103 B2 * | 12/2014 | Schaller | H01L 21/67736 318/568.12 |
| 8,961,094 B2 * | 2/2015 | Ruth et al. | 414/222.04 |
| 2003/0113189 A1 | 6/2003 | Kaji et al. | |
| 2005/0095090 A1 | 5/2005 | Stone | |
| 2006/0182529 A1 | 8/2006 | Hiroki | |
| 2007/0116549 A1 * | 5/2007 | Rice | H01L 21/67742 414/744.5 |
| 2007/0264114 A1 | 11/2007 | Ma et al. | |
| 2008/0260500 A1 * | 10/2008 | Meulen | B65G 25/02 414/217 |
| 2010/0226736 A1 * | 9/2010 | Borden | 414/217 |
| 2010/0279439 A1 * | 11/2010 | Shah et al. | 438/15 |
| 2010/0300834 A1 * | 12/2010 | Yokoo et al. | 198/346.2 |
| 2011/0108742 A1 | 5/2011 | Weaver et al. | |
| 2011/0189384 A1 * | 8/2011 | Shimizu et al. | 427/74 |
| 2011/0245957 A1 * | 10/2011 | Porthouse et al. | 700/114 |
| 2011/0313565 A1 * | 12/2011 | Yoo | H01L 21/6773 700/218 |
| 2013/0108406 A1 * | 5/2013 | Schaller et al. | 414/744.3 |
| 2014/0023461 A1 * | 1/2014 | Schaller | H01L 21/67742 414/222.07 |

FOREIGN PATENT DOCUMENTS

| | | | | |
|---|---|---|---|---|
| DE | 202012102503 U1 * | 9/2012 | | B65G 59/026 |
| JP | 06023684 A * | 2/1994 | | B65G 47/91 |
| KR | 10-2009-0115430 A | 11/2009 | | |
| WO | WO 2008/031648 A1 * | 3/2008 | | B65G 43/02 |
| WO | 2010/112613 A1 | 10/2010 | | |

* cited by examiner

WORKPIECE HANDLING SYSTEM AND METHODS OF WORKPIECE HANDLING

CROSS-REFERENCE TO RELATED APPLICATIONS

This application claims priority to the provisional patent application entitled "High-Throughput Workpiece Handling," filed Nov. 2, 2011 and assigned U.S. App. No. 61/554,715, the disclosure of which is hereby incorporated by reference.

FIELD

This invention relates to workpiece handling and, more particularly, to workpiece handling for high-throughput applications.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the ion beam penetrate into the bulk of the workpiece material and are embedded into the crystalline lattice of the workpiece material to form a region of desired conductivity.

Two concerns of the solar cell manufacturing industry are manufacturing throughput and cell efficiency. Cell efficiency measures the amount of energy converted into electricity. Higher cell efficiencies may be needed to stay competitive. However, manufacturing throughput likely cannot be sacrificed at the expense of increased cell efficiency.

Ion implantation has been demonstrated as a viable method to dope solar cells. Use of ion implantation removes process steps needed for existing technology, such as diffusion furnaces, which increases throughput and may lower costs. For example, a laser edge isolation step may be removed if ion implantation is used instead of furnace diffusion because ion implantation will only dope the desired surface. Besides removal of process steps, higher cell efficiencies have been demonstrated using ion implantation. Ion implantation also offers the ability to perform a blanket implant of an entire surface of a solar cell or a selective (or patterned) implant of only part of the solar cell. Selective implantation at high throughputs using ion implantation avoids the costly and time-consuming lithography or patterning steps used for furnace diffusion. Any improvement to manufacturing throughput of an ion implanter or its reliability would be beneficial to solar cell manufacturers worldwide. This may accelerate the adoption of solar cells as an alternative energy source.

SUMMARY

According to a first aspect of the invention, a workpiece handling system is provided. The workpiece handling system comprises a plurality of conveyor belts and a load lock. A first swap robot is configured to hold a plurality of workpieces and transports the plurality of workpieces between a build station and the load lock. A gantry robot is configured to transport a plurality of workpieces between each of the plurality of conveyor belts and the first swap robot.

According to a second aspect of the invention, a method of workpiece handling is provided. The method comprises transporting a plurality of processed workpieces from a swap robot to a first conveyor belt using a gantry robot. The swap robot contains a plurality of columns of the processed workpieces. A plurality of unprocessed workpieces are transported from a second conveyor belt to the swap robot using the gantry robot. Transporting the processed workpieces and the unprocessed workpieces is repeated until all of the processed workpieces on the swap robot have been replaced with the unprocessed workpieces.

According to a third aspect of the invention, a method of workpiece handling is provided. The method comprises loading a plurality of unprocessed workpieces on a first swap robot while a second swap robot is positioned underneath the first swap robot. The second swap robot is moved into a load lock to load a plurality of processed workpieces on the second swap robot while the first swap robot is positioned outside of the load lock. The second swap robot and the plurality of processed workpieces are removed from the load lock. The first swap robot is moved into the load lock while the second swap robot is positioned outside of the load lock. The first swap robot is removed from the load lock. A second plurality of unprocessed workpieces are loaded on the second swap robot and the plurality of processed workpieces are unloaded from the second swap robot while the first swap robot is in a parked position.

BRIEF DESCRIPTION OF THE DRAWINGS

For a better understanding of the present disclosure, reference is made to the accompanying drawings, which are incorporated herein by reference and in which.

DETAILED DESCRIPTION

The workpiece handling system herein is described in connection with solar cells. However, the embodiments can be used with other workpieces such as semiconductor wafers, light emitting diodes (LEDs), silicon-on-insulator (SOI) wafers, or other devices. The workpiece handling system can be used with ion implanters or with other processing equipment such as deposition, etching, or other workpiece processing systems. Thus, the invention is not limited to the specific embodiments described below.

Figure 1:
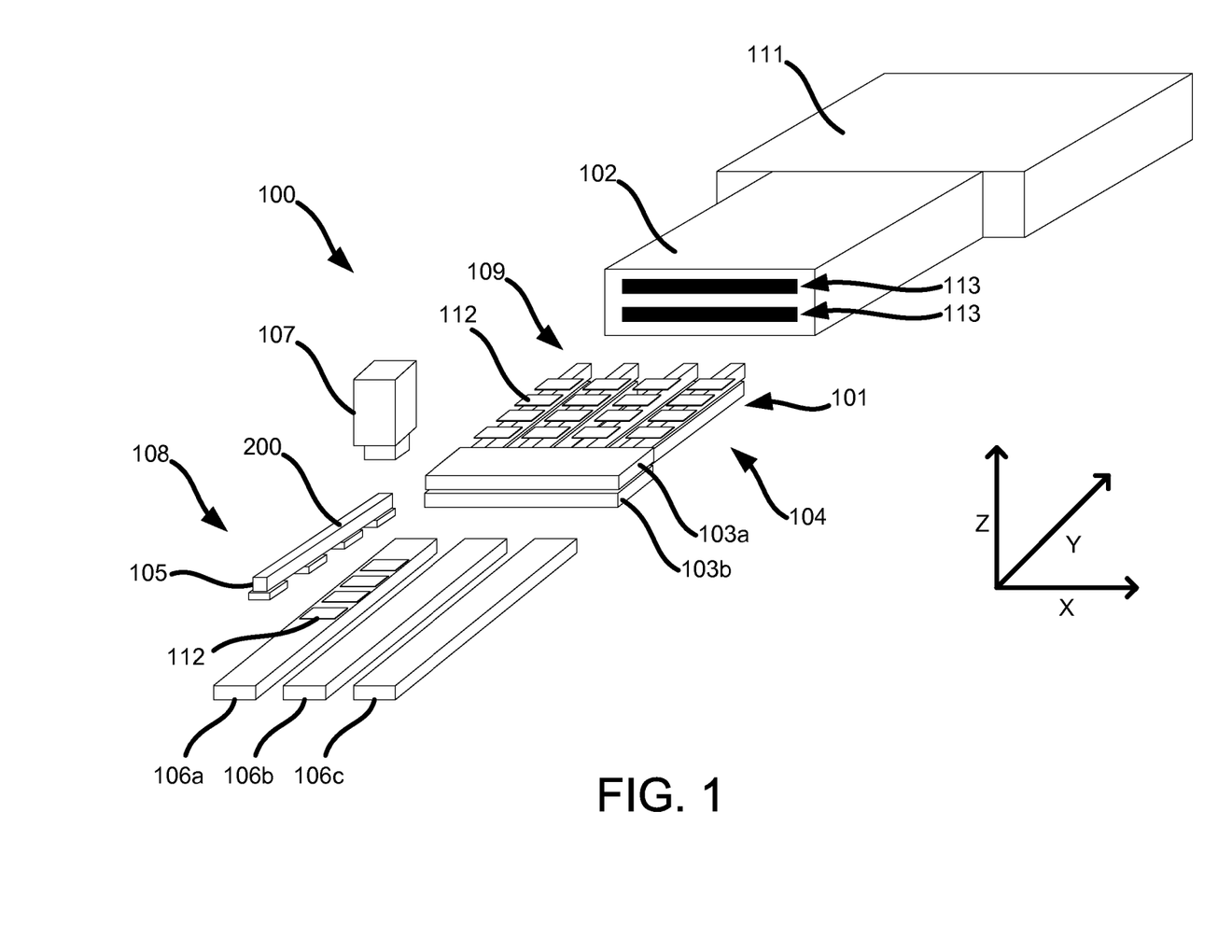
FIG. 1 is a perspective view of a first embodiment of a workpiece handling system.
Figure 2:
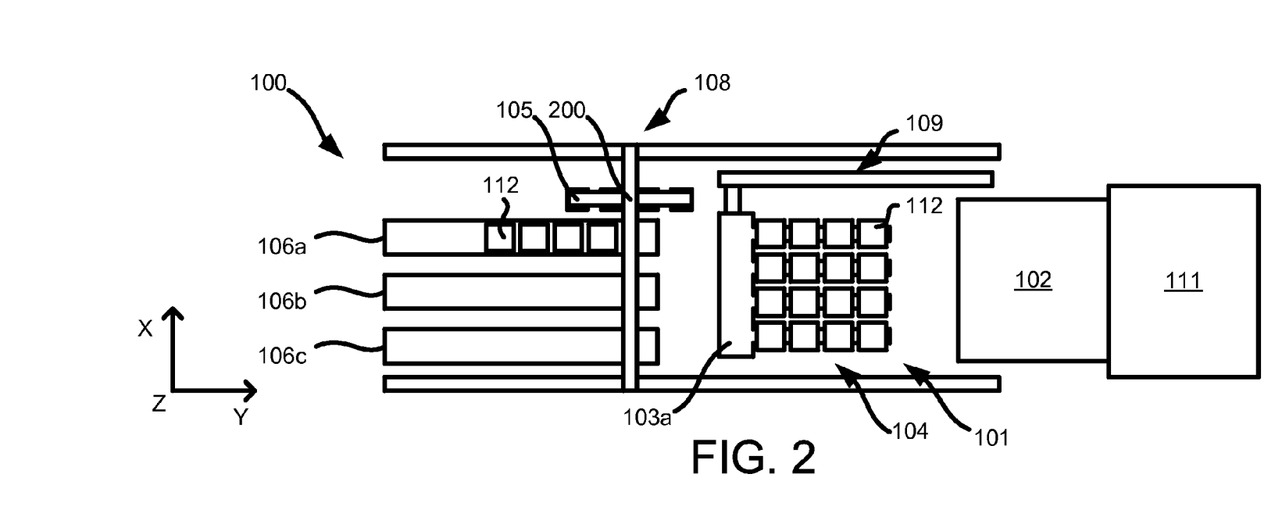
FIG. 2 is a top perspective view of the first embodiment of a workpiece handling system illustrated in FIG. 1.
Figure 3:
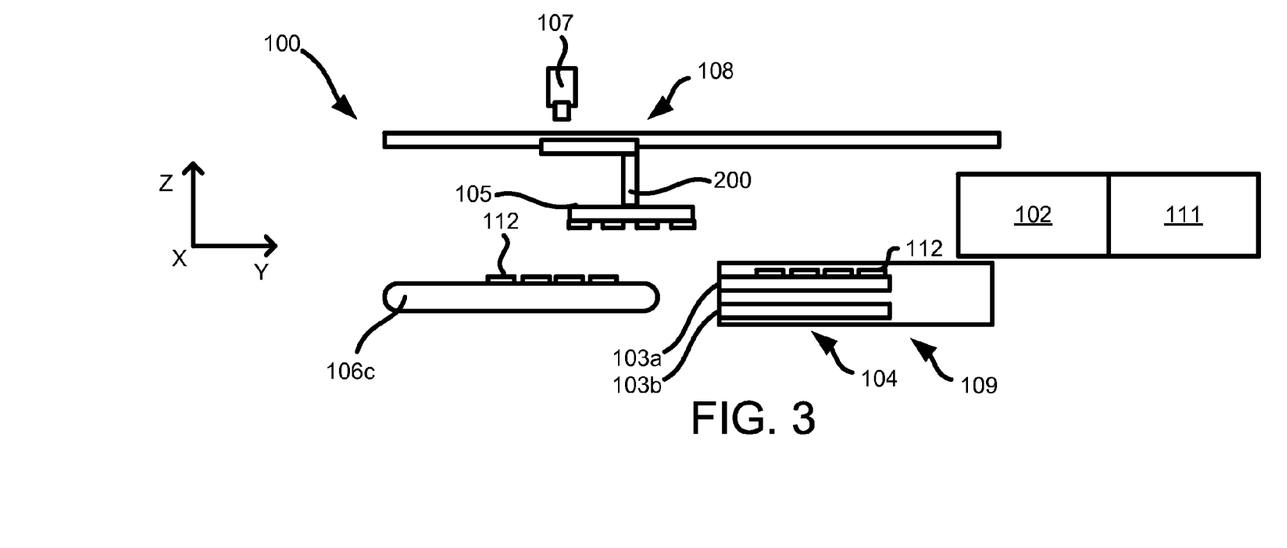
FIG. 3 is a side perspective view of the first embodiment of a workpiece handling system illustrated in FIG. 1.

The workpiece handling system 100 illustrated in FIGS. 1-3 may be capable of processing approximately 3000 wafers or workpieces per hour (wph) using a matrix 101 of workpieces 112 that is 4×4. Of course, other matrix 101 designs may be used and the embodiments herein are not limited merely to a matrix 101 that is 4×4.

This workpiece handling system 100 transfers workpieces 112 from a cassette or other interface (not illustrated), builds the matrix 101 of workpieces 112, and moves the matrix 101 of workpieces 112 into the load lock 102. The load lock 102 is connected to part of an ion implanter 111 or some other piece of processing equipment. The load lock 102 is used to separate the vacuum condition of the ion implanter 111 from the external atmospheric condition and can either raise or lower the pressure of the load lock 102. The workpieces 112 may be placed in a carrier that uses mechanical or electrostatic clamping inside the load lock 102 or ion implanter 111 in one instance. The reverse process also may be performed by the workpiece handling system 100 to transfer workpieces 112 back to the cassette or other interface. The load lock 102 in FIGS. 1-3 may have one or more load lock chambers. In the embodiment of FIG. 1, two load lock apertures 113 are illustrated, each leading to a separate load lock chamber connected to the ion implanter 111. These two load lock chambers inside the load lock 102 may be positioned on top of one another. In an alternate embodiment, these two load lock chambers may be separated by a gap between them.

In this embodiment, three conveyor belts 106a-c will transport the workpieces 112 from the cassette or other interface. The transport of the workpieces 112 is performed at a specified speed, interval, or pitch. A robot may be used to place the workpieces 112 onto the conveyor belt 106a-c in one instance. In another instance, the workpieces 112 are unloaded directly from the cassette onto the conveyor belts 106a-c. More or less than three conveyor belts 106a-c may be used in other embodiments. Each of the conveyor belts 106a-c may be designated for load or unload of workpieces or may be used for both loading and unloading. In one specific instance, one conveyor belt 106a is used for unloading workpieces 112 from the cassette while another conveyor belt 106c is used for loading workpieces 112 into the cassette. However, the load or unload functions of the conveyor belts 106a-c may vary during operation. This may be based on whether the cassette served by a particular conveyor belt 106a-c is empty or full, for example.

Positioned above the conveyor belts 106a-c, the camera 107 and a processor connected to the camera 107 will determine the position of the workpieces 112 on or with respect to one of the conveyor belts 106a-c and if the position or orientation of the workpieces 112 needs to be corrected during the transfer to the matrix 101. The camera 107 has a view of part of the conveyor belts 106a-c. In one instance, the camera 107 has a field of view large enough to see or image multiple workpieces 112, such as a row of four workpieces 112, on one of the conveyor belts 106a-c. In another instance, the camera 107 has a field of view that can image multiple workpieces 112 on each conveyor belt 106a-c. For example, the camera 107 may be able to image four workpieces 112 on each conveyor belt 106a-c.

A gantry module 108 picks workpieces 112 from one of the conveyor belts 106a-c and builds the matrix 101, such as using electrostatic, mechanical, or vacuum forces. In one embodiment, the gantry module 108 includes a frame or rails above the conveyor belts 106a-c that enable movement. The gantry module 108 includes a gantry robot 200 and can move in three-dimensions and can tilt. Thus, the gantry module 108 can pick up workpieces 112 from any of the conveyor belts 106a-c or place workpieces 112 on any of the conveyor belts 106a-c. The gantry module 108 also can remove workpieces 112 from the matrix 101 to place onto any of the conveyor belts 106a-c for transfer back to the cassette or other interface. The matrix end effector 105 is connected to the gantry robot 200 of the gantry module 108. This matrix end effector 105 is capable of holding four workpieces 112 in one specific embodiment, though other numbers of workpieces 112 are possible. This gantry module 108 can use information from the camera 107 and processor to correct the position or orientation of the workpieces 112, such as during transport.

The gantry module 108 may have two y-axis actuators, one x-axis actuator, one z-axis actuator, and a tilt actuator in one embodiment. This provides four degrees of freedom and enables pick-and-place operation of the workpieces 112. The gantry module 108 may adjust the position of the matrix end effector 105 to match positions of the workpieces 112 on one of the conveyor belts 106a-c. The gantry module 108 also can correct one or more of the workpieces 112, for example, in the x, y, and θ (tilt) directions. The gantry module 108 can transport the workpieces 112 between any of the conveyor belts 106a-c to any of the positions in the matrix 101, which may be on part of the swap module 109 such as the swap robot 103a. Correction may occur during this transport, for example. Up to 180° rotation or tilting in the θ direction may be performed by the gantry module 108.

In an alternate embodiment, the gantry module 108 can skip or not place "bad" workpieces. These "bad" workpieces may be damaged or broken. The gantry module 108 also may compensate for "missing" workpieces that may not have properly loaded onto the conveyor belts 106a-c on in the matrix 101. The camera 107 and the processor connected to the camera 107 may be used to assist the gantry module 108 in this regard.

The end effector 105 of the gantry module 108 is a multi-gripper design that is a smaller version of the matrix 101. Thus, while the matrix 101 may be 4×4 workpieces 112, the gantry module 108 may be 1×4 or some other design. The workpieces 112 may be corrected by the gantry module 108 either individually or as a group.

In one embodiment of operation, the gantry module 108 takes four workpieces 112 that have been processed and places these on one of the conveyor belts 106a-c. The gantry module 108 then takes four unprocessed workpieces 112 from the conveyor belts 106a-c and places these in the matrix 101. The processed and unprocessed workpieces 112 may go on different conveyor belts 106a-c. This reduces the amount of travel time for the gantry module 108 and reduces the time that the gantry module 108 is not transporting workpieces 112. The unprocessed workpieces 112 are placed in the matrix 101 where the previously processed workpieces 112 were removed from. This process may be repeated and the combined load and unload of the matrix 101 by the gantry module 108 may be used to replace the entire matrix 101 with different workpieces 112.

A swap module 109 will transport the matrix 101 of workpieces 112 between the build station 104 and the load lock 102. This swap module 109 contains at least one swap robot 103 (or "swapbot") that each may use one or more a linear actuators. For example, in the embodiment of FIG. 1, a swap robot 103a and swap robot 103b are illustrated. The swap robot 103a is positioned above the swap robot 103b. One of the swap robots 103a-b may be parked out of the way during loading and unloading. In one embodiment, each swap robot 103a-b has a z-axis actuator and two y-axis actuators for the blades that the workpieces 112 are placed on or held by.

In one instance, the swap robot 103a may take unprocessed workpieces 112 in the matrix 101 from the build station 104 and the swap robot 103b may extend into the load lock 102 to take processed workpieces 112. The processed workpieces 112 are removed from the load lock 102 and the unprocessed workpieces 112 are placed in the load lock 102. The processed workpieces 112 are returned to the build station 104 for unloading while the unprocessed workpieces 112 are implanted or otherwise processed.

The building of the matrix 101 may be coordinated with the pumping down or venting of the load lock 102. This may increase throughput of the system attached to the load lock 102, such as the ion implanter 111.

Figure 4A:
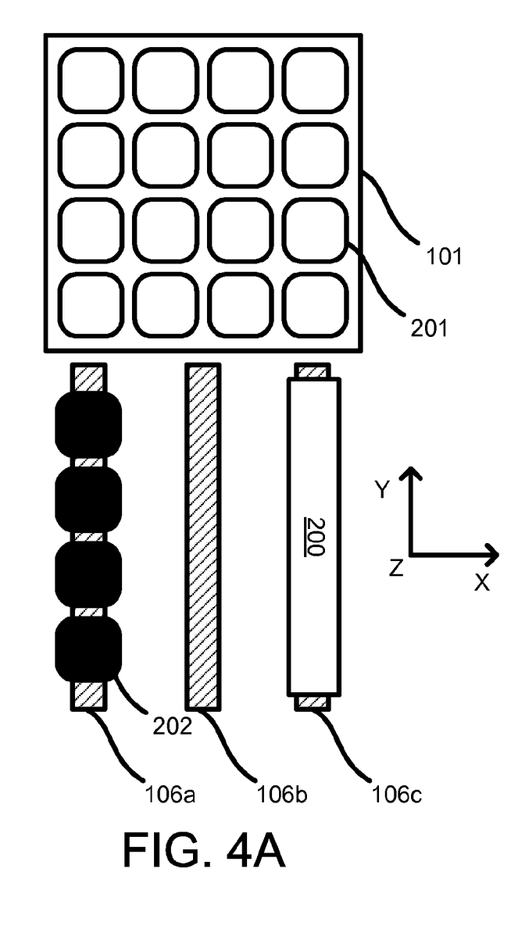
FIGS. 4A-4E illustrate one embodiment of workpiece handling using the workpiece handling system illustrated in FIGS. 1-3.

FIGS. 4A-4E illustrate one embodiment of workpiece handling using the workpiece handling system illustrated in FIGS. 1-3. In FIG. 4A, the gantry robot 200, which may be part of the gantry module 108 of FIGS. 1-3, is positioned over a first conveyor belt 106c. The matrix 101 contains sixteen processed workpieces 201 in a 4×4 arrangement, which in this embodiment includes four columns of the processed workpieces 201. The matrix 101 may be on or held by one of the swap robots 103a-b as illustrated in FIGS. 1-3. One conveyor belt 106a-c, in this instance conveyor belt 106a, contains unprocessed workpieces 202 (shaded in the embodiment of FIG. 4A). The processed workpieces 201 and unprocessed workpieces 202 are examples of the workpieces 112 illustrated in FIGS. 1-3.

Figure 4B:
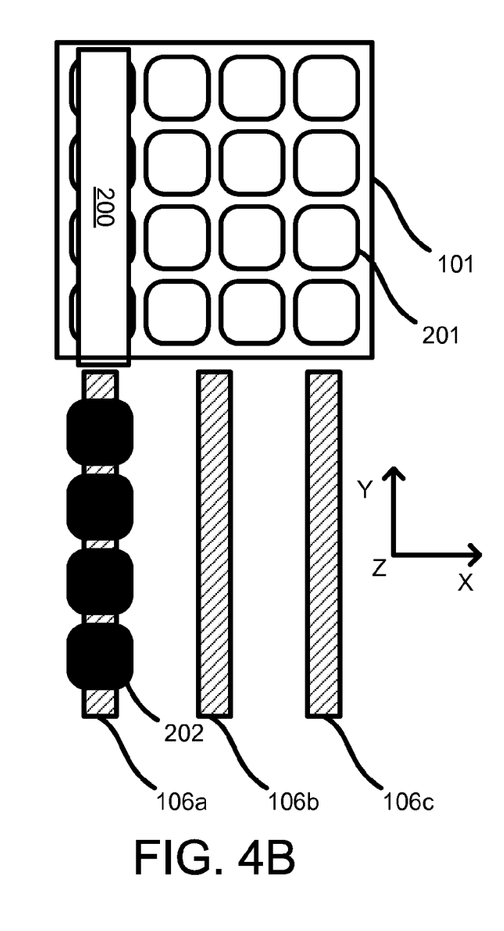

In FIG. 4B, the gantry robot 200 is positioned over the matrix 101 and picks up four processed workpieces 201 from the matrix 101. These four processed workpiece 201 represent one column. The gantry robot 200 may correct the position or tilt of the processed workpieces 201 after these have been gripped or picked up.

Figure 4C:
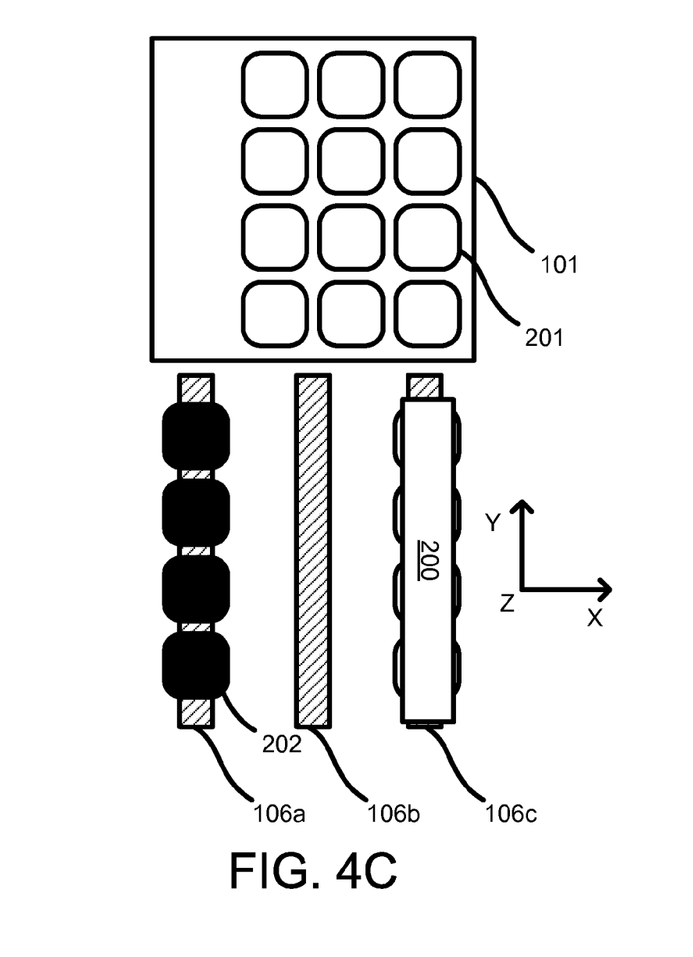
Figure 4D:
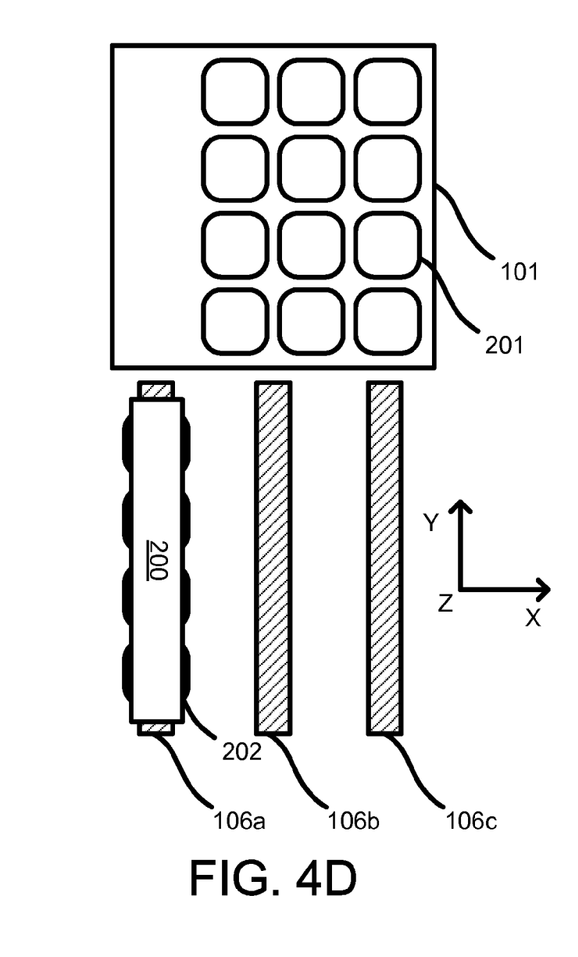

In FIG. 4C, the gantry robot 200 has transported the four processed workpieces 201 to one of the conveyor belts 106a-c, in this case conveyor belt 106c for unloading. The gantry robot 200 is positioned over the unprocessed workpieces 202 in FIG. 4D and picks these unprocessed workpieces 202 up. The gantry robot 200 may correct the position or tilt of the unprocessed workpieces 202 after these have been gripped or picked up. The unprocessed workpieces 202 may be crooked or positioned incorrectly due to errors in unloading from the cassette or other interface (not illustrated).

Figure 4E:
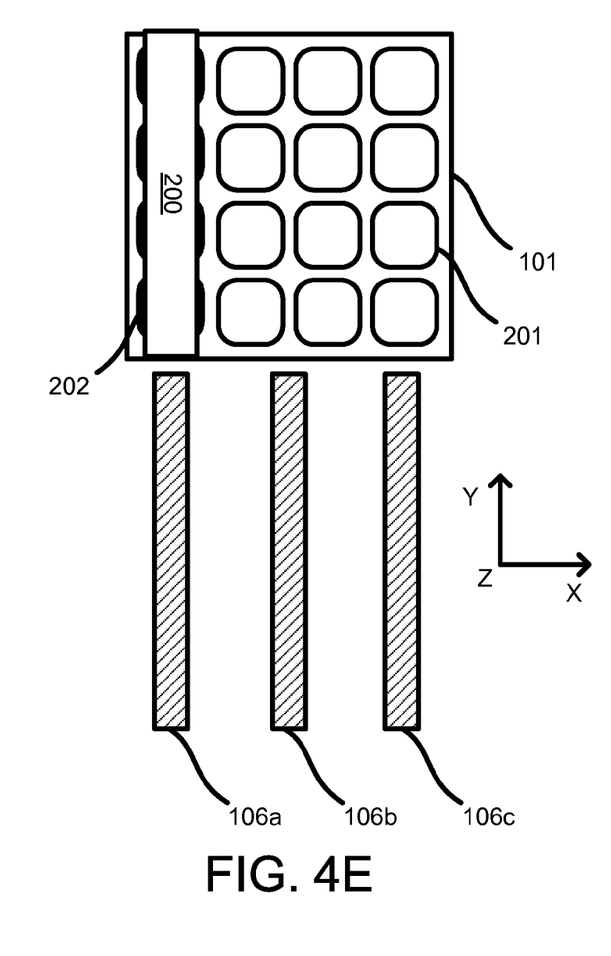

In FIG. 4E, the gantry robot 200 places the four unprocessed workpieces 202 into the matrix 101. The unloaded processed workpieces 201 may have been removed to the cassette or other interface using one of the conveyor belts 106a-c. More unprocessed workpieces 202 may be loaded onto one of the conveyor belts 106a-c. This process is repeated until the processed workpieces 201 are unloaded from the matrix 101 and the unprocessed workpieces 202 have been loaded into the matrix 101. Thus, the processed workpieces 201 in the matrix 101 are replaced with the unprocessed workpieces 202.

The loading and unloading processes illustrated in FIGS. 4A-4E may occur sequentially during a period of movement of the gantry robot 200. Thus, during a particular period of gantry robot 200 activity, the gantry robot 200 will both load unprocessed workpieces 202 into the matrix 101 and unload processed workpieces 201 from the matrix 101. The various steps of the loading and unloading processes may occur in an alternating manner during this activity until the processed workpieces 201 in the matrix 101 are replaced with the unprocessed workpieces 202. Other sequences of steps to load or unload the matrix 101 using the gantry robot 200 are possible.

Figure 5A:
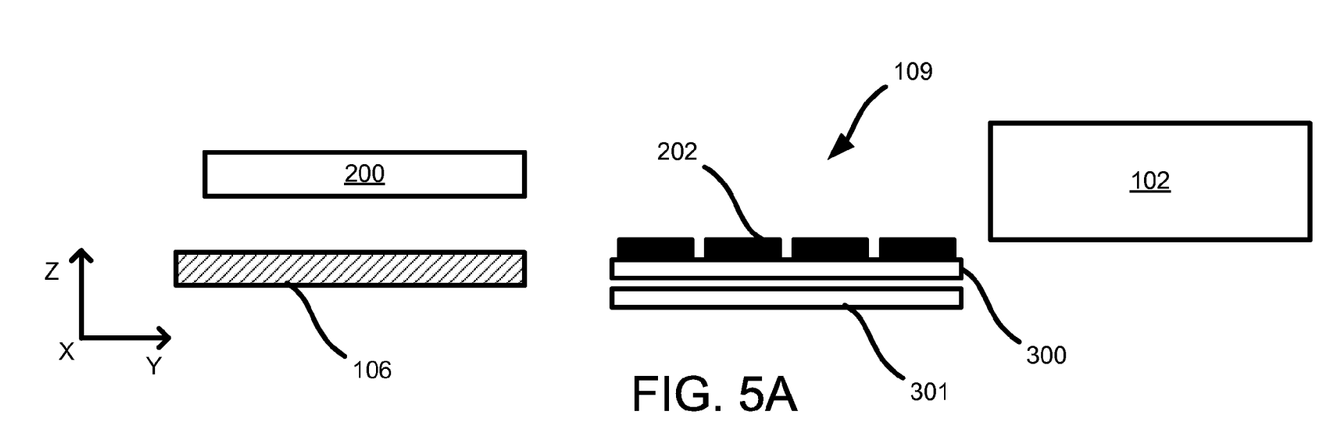
FIGS. 5A-5F illustrate another embodiment of workpiece handling using the workpiece handling system illustrated in FIGS. 1-3.

FIGS. 5A-5F illustrate another embodiment of workpiece handling using the workpiece handling system illustrated in FIGS. 1-3. The first swap robot 300 and second swap robot 301 may be part of the swap module 109 of FIGS. 1-3 and may correspond to the swap robots 103a-b in one instance. In FIG. 5A, the gantry robot 200 has loaded unprocessed workpieces 202 on the first swap robot 300 from one of the conveyor belts 106. These unprocessed workpiece 202 may be in a 4×4 matrix, though only four are illustrated in FIG. 5A because FIG. 5A is a cross-sectional view. The second swap robot 301 is positioned underneath the first swap robot 300 during the loading.

Figure 5B:
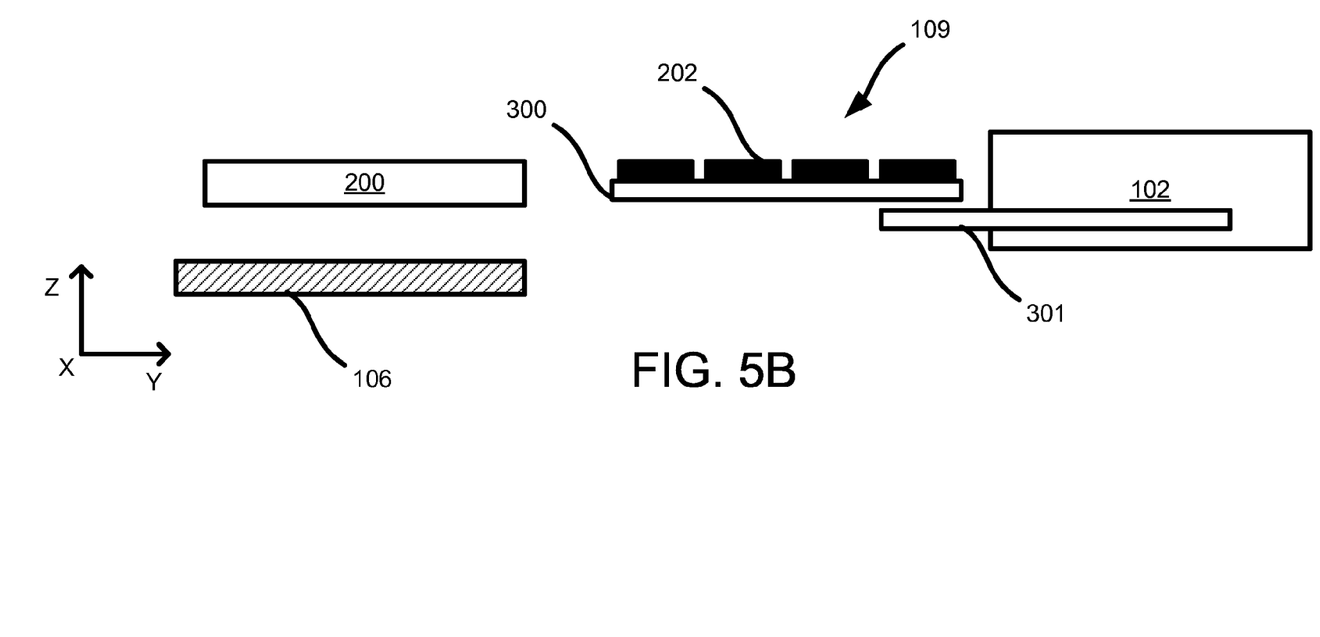
Figure 5C:
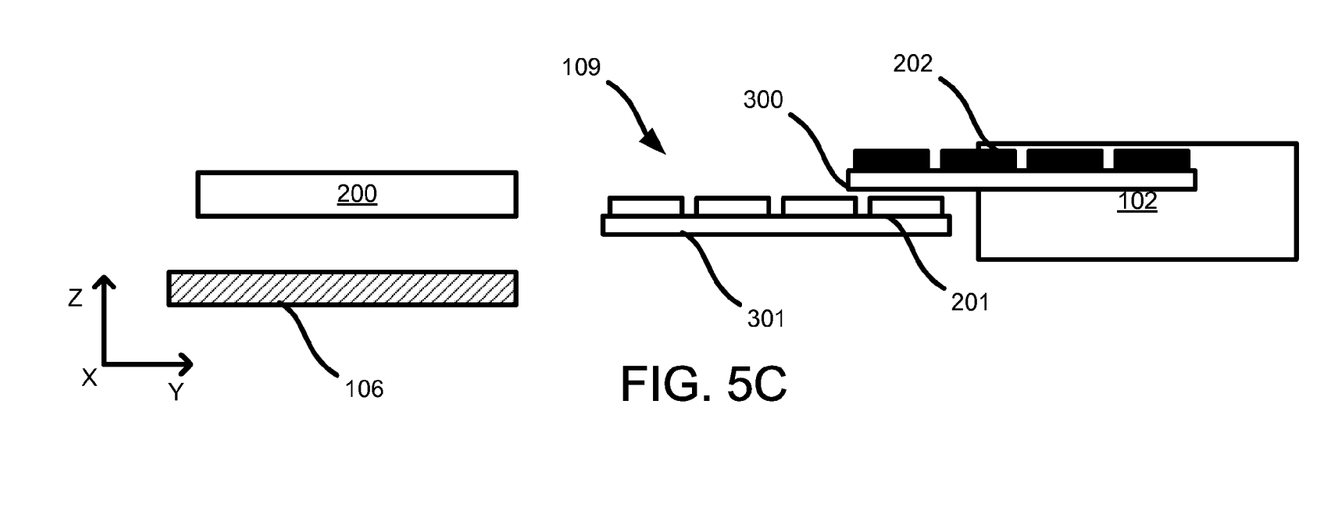

The first swap robot 300 and second swap robot 301 are moved in the vertical direction in FIG. 5B and the second swap robot 301, which is empty, extends into the load lock 102. The second swap robot 301 removes processed workpieces 201 in FIG. 5C, which also may be in a 4×4 matrix. The first swap robot 300 then places the unprocessed workpieces 202 into the load lock 102. The first swap robot 300 and second swap robot 301 may change vertical position during the loading and unloading of the load lock 102 if it only has a single aperture. If the load lock 102 has multiple apertures or an aperture large enough to accommodate both the first swap robot 300 and second swap robot 301, then no vertical position change during loading and unloading may be required.

Figure 5D:
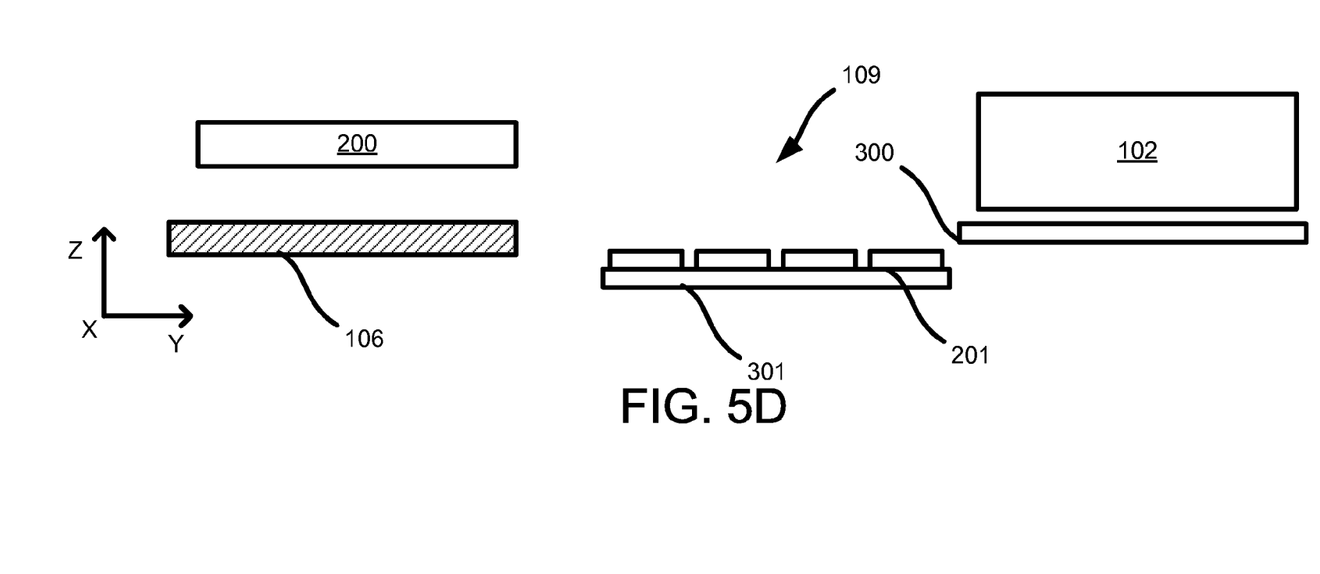
Figure 5E:
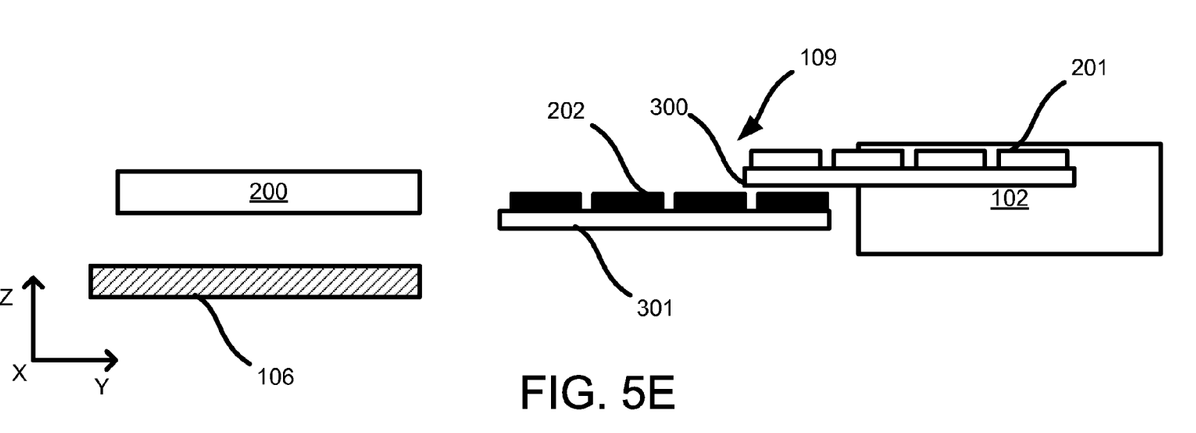
Figure 5F:
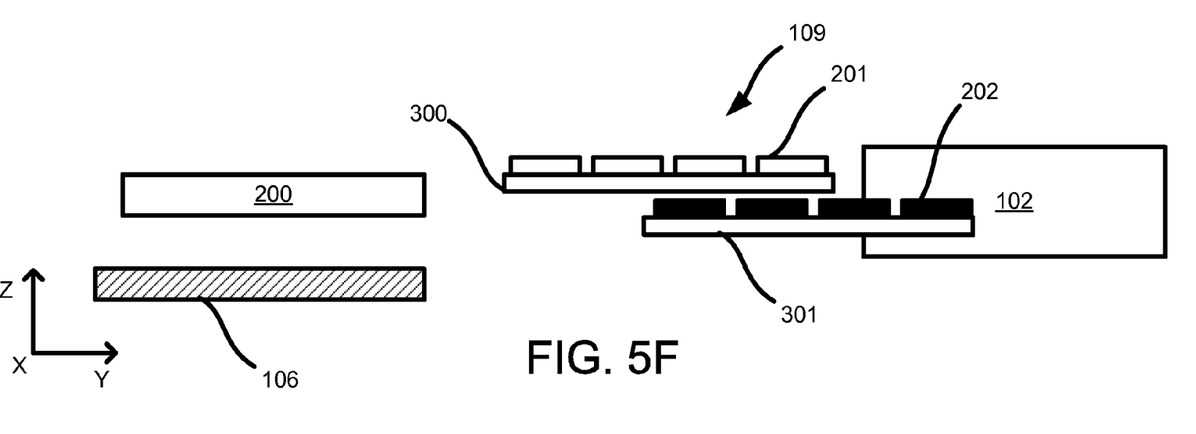

In FIG. 5D, the first swap robot 300 is parked out of the way. For example, the first swap robot 300 may be parked under the load lock 102 or elsewhere. This enables the gantry robot 200 to unload the processed workpieces 201 from the second swap robot 300 onto one of the conveyor belts 106. The gantry robot 200 also may load unprocessed workpieces 202 on the second swap robot 301. The first swap robot 300 will be removed from the parked position, unload processed workpieces 201 from the load lock 102 as seen in FIG. 5E, and then the second swap robot 301 will place unprocessed workpieces 202 into the load lock 102 as seen in FIG. 5F. The gantry robot 200 will unload the processed workpieces 201 from the first swap robot 300 onto one of the conveyor belts 106 and load unprocessed workpieces 202 onto this first swap robot 300 from one of the conveyor belts 106. Then the process then may begin again as illustrated in FIG. 5A. The second swap robot 301 may be placed in a parked position or may just remain disposed under the first swap robot 300 during loading and unloading of the first swap robot 300.

The process illustrated in FIGS. 5A-5F may be used with a system having two load lock chambers position one or above the other in the vertical direction. In this embodiment, the first swap robot 300 and second swap robot 301 may have greater movement range in the vertical direction. The first swap robot 300 may be parked in a gap between the two load lock chambers or under the lowermost load lock, for example.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. These other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A workpiece handling system comprising:
    a plurality of conveyor belts;

a load lock;

a gantry robot, configured to move in x,y,z and tilt directions, comprising an end effector having a plurality of grippers, wherein said plurality of grippers are configured to pick up a plurality of workpieces from one of said plurality of conveyor belts and wherein said gantry robot is configured to transport said plurality of workpieces, as a linear array, between each of said plurality of conveyor belts and a build station, wherein said plurality of workpieces form part of a two dimensional matrix of workpieces built at said build station; and a first swap robot and a second swap robot, each comprising a plurality of blades configured to hold a plurality of workpieces, wherein said first swap robot and said second swap robot are each configured to transport a respective matrix of workpieces between said build station and said load lock, wherein said first swap robot is disposed above the second swap robot, and wherein the first swap robot and the second swap robot are movable in exactly two directions, and are configured to move independently of each other in a horizontal direction and wherein the first swap robot and second swap robot are configured to move together in a vertical direction, such that the first swap robot is configured to be moved in the horizontal direction to a parked position when said gantry robot is loading or unloading a matrix associated with said second swap robot.

2. The workpiece handling system of claim 1, further comprising a camera having a field of view configured to image said plurality of conveyor belts.

3. The workpiece handling system of claim 2, wherein the end effector uses information from the camera to correct the position or orientation of the workpieces as the workpieces are transported between the build station and the plurality of conveyor belts.

4. The workpiece handling system of claim 1, wherein said plurality of conveyor belts comprises three conveyor belts, each configured to load and unload said workpieces.

5. The workpiece handling system of claim 1, further comprising a second load lock, wherein said first swap robot and said second swap robot are configured to transport said matrix of workpieces between said build station and said load lock and said second load lock.

6. The workpiece handling system of claim 1, wherein the swap robot is configured to move in y and z directions.

7. The workpiece handling system of claim 1, wherein the gantry robot is configured to transport processed workpieces from the build station to a first of the plurality of conveyor belts, move to a second conveyor belt and then pick up unprocessed workpieces from the second conveyor belt and transport the unprocessed workpieces to the build station.

8. The workpiece handling system of claim 7, wherein the gantry robot is configured to place the unprocessed workpieces in a location in the build station vacated by the processed workpieces that were transported to the first conveyor belt.

9. The workpiece handling system of claim 1, wherein the first swap robot is configured to remove processed workpieces from the load lock and the second swap robot is configured to subsequently place unprocessed workpieces into the load lock.

10. The workpiece handling system of claim 1, wherein the second swap robot is configured to place a matrix of unprocessed workpieces into the load lock after the first swap robot removes a matrix of processed workpieces from the load lock.

11. The workpiece handling system of claim 10, wherein the second swap robot is disposed in a parked position beneath the first swap robot when said gantry robot is loading or unloading a matrix associated with said first swap robot, and the first swap robot is configured to place a matrix of unprocessed workpieces into the load lock after the second swap robot removes a matrix of processed workpieces from the load lock.

* * * * *